(12) United States Patent
Cheng et al.

(10) Patent No.: US 9,759,972 B2
(45) Date of Patent: Sep. 12, 2017

(54) ARRAY SUBSTRATE AND DISPLAY DEVICE

(71) Applicant: Boe Technology Group Co., Ltd., Beijing (CN)

(72) Inventors: Hongfei Cheng, Beijing (CN); Jianbo Xian, Beijing (CN); Jian Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/907,079

(22) PCT Filed: Aug. 20, 2015

(86) PCT No.: PCT/CN2015/087697
§ 371 (c)(1),
(2) Date: Jan. 22, 2016

(87) PCT Pub. No.: WO2016/141682
PCT Pub. Date: Sep. 15, 2016

(65) Prior Publication Data
US 2017/0038654 A1    Feb. 9, 2017

(30) Foreign Application Priority Data
Mar. 12, 2015  (CN) .................... 2015 2 0141230 U

(51) Int. Cl.
*H01L 27/12*    (2006.01)
*G02F 1/1362*    (2006.01)
(Continued)

(52) U.S. Cl.
CPC ...... *G02F 1/136286* (2013.01); *G02F 1/1362* (2013.01); *G02F 1/1368* (2013.01);
(Continued)

(58) Field of Classification Search
CPC .................................................. H01L 27/1218
(Continued)

(56) References Cited

U.S. PATENT DOCUMENTS

| | | | | |
|---|---|---|---|---|
| 8,253,873 B2* | 8/2012 | Sasaki | ................ | H01L 27/1255 349/114 |
| 8,299,469 B2* | 10/2012 | Chang | ................ | H01L 27/1255 257/223 |
| 8,482,710 B2* | 7/2013 | Yang | ................ | H01L 27/1214 349/138 |

FOREIGN PATENT DOCUMENTS

| | | |
|---|---|---|
| CN | 2757177 | 2/2006 |
| CN | 101382708 | 3/2009 |

(Continued)

OTHER PUBLICATIONS

International Search Report and Written Opinion from PCT/CN15/087697 dated Dec. 2, 2015.

*Primary Examiner* — Chandra Chaudhari
(74) *Attorney, Agent, or Firm* — Calfee, Halter & Griswold LLP

(57) ABSTRACT

An array substrate and a display device. The array substrate comprises a common electrode line, a plurality of gate lines and a plurality of data lines which intersect with each other, and pixel units defined by neighboring in gate lines. A storage electrode line is provided, so that storage capacitance between the storage electrode line and the pixel electrode can compensate storage capacitance formed between the common electrode and the pixel electrode. The ability of charge retention of the pixel electrode can be increased, so that voltage of the pixel electrode is constant during display period of a frame, and the display effect of a picture is ensured.

18 Claims, 3 Drawing Sheets

(51) Int. Cl.
  *G02F 1/1368* (2006.01)
  *H01L 23/50* (2006.01)
  *H01L 27/02* (2006.01)
  *G02F 1/1333* (2006.01)
  *G02F 1/1343* (2006.01)
  *G02F 1/136* (2006.01)
(52) U.S. Cl.
  CPC .. *G02F 1/133345* (2013.01); *G02F 1/134309* (2013.01); *H01L 23/50* (2013.01); *H01L 27/02* (2013.01); *H01L 27/124* (2013.01); *H01L 27/1288* (2013.01); *G02F 2001/13606* (2013.01); *G02F 2201/121* (2013.01); *G02F 2201/123* (2013.01)
(58) Field of Classification Search
  USPC .......................................................... 257/43
  See application file for complete search history.

(56) References Cited

FOREIGN PATENT DOCUMENTS

| CN | 102088025 | 6/2011 |
|---|---|---|
| CN | 103353695 | 10/2013 |
| CN | 204422935 | 6/2015 |
| JP | 2007052418 | 3/2007 |
| KR | 10-2005-0053281 | 6/2005 |

* cited by examiner

ARRAY SUBSTRATE AND DISPLAY DEVICE

RELATED APPLICATIONS

The present application is the U.S. national phase entry of PCT/CN2015/087697, with an international filing date of Aug. 20, 2015, which claims the benefit of Chinese Application No. 201520141230.X, filed on Mar. 12, 2015, the entire disclosures of which are incorporated herein by reference.

FIELD OF THE INVENTION

The present invention relates to the filed of display technology, and particularly to an array substrate and a display device.

BACKGROUND OF THE INVENTION

With the development of display technology and the progress of society, liquid crystal display technology has been widely applied and is now playing a vital role in industrial production and people's living.

The liquid crystal display mode can be divided into a twisted nematic (TN) mode, a vertical aligned (VA) mode, and a horizontal electrical field mode. The horizontal electrical field mode comprises an in-plane switching (IPS) mode and a fringe field switching (FFS) mode. A liquid crystal display device of the FFS mode has been widely applied due to a wide view angle and high transmittance.

As for the FFS mode, a liquid crystal display panel comprises an array substrate and a color film substrate. The array substrate comprises a plurality of gate lines, a plurality of data lines, and a plurality of pixels units. The gate lines and the data lines intersect with each other in a perpendicular way. Pixel units are defined by neighboring gate lines and neighboring data lines. Each of the pixel units comprises a thin film transistor, a pixel electrode, and a common electrode. The common electrode is located above the pixel electrode, and slits are formed in the common electrode. An insulating layer is arranged between the pixel electrode and the common electrode. A data line signal voltage is loaded to the pixel electrode through the thin film transistor. The whole common electrode covers all pixel units, and is connected with the common electrode line in a non-display area.

The common electrode at least partially overlaps the data lines or gate lines. In order to reduce parasitic capacitance between the data lines or gate lines and the common electrode, a thickness of the insulating layer between the common electrode and the data lines or gate lines is increased accordingly. This also decreases storage capacitance formed between the pixel electrode and the common electrode, so that voltage of the pixel electrode is subject to variation during display of a frame, and the display effect is influenced.

SUMMARY OF THE INVENTION

With respect to the above problems in the prior art, the present invention provides an array substrate and a display device. In the array substrate, storage capacitance can be formed between a storage electrode line and a pixel electrode, and compensate storage capacitance formed between a common electrode and the pixel electrode. As a result, decrease of storage capacitance between the common electrode and the pixel electrode due to increase in thickness of a first insulating layer can be avoided. Further, the ability of charge retention of the pixel electrode can be increased, so that voltage of the pixel electrode is constant during display period of a frame, and the display effect of a picture is ensured.

The present invention provides an array substrate, comprising a common electrode line, a plurality of gate lines and a plurality of data lines which intersect with each other, and pixel units defined by neighboring gate lines and neighboring data lines. Each of the pixel units comprises a pixel electrode and a common electrode, a first insulating layer is arranged between the pixel electrode and the common electrode. Each of the pixel units further comprises a storage electrode line, the storage electrode line and the pixel electrode at least partially overlap. A second insulating layer is arranged between the storage electrode line and the pixel electrode, and the storage electrode line and the common electrode are connected with the common electrode line, respectively. Since the storage electrode line and the pixel electrode at least partially overlap and are spaced apart by a second liquid crystal layer, an additional storage capacitance is formed between the storage electrode line and the pixel electrode. The additional storage capacitance can compensate the storage capacitance between the pixel electrode and the common electrode, so that decrease of storage capacitance due to increase in thickness of the first insulating layer between the pixel electrode and the common electrode can be avoided.

The expression "the storage electrode line and the pixel electrode at least partially overlap" used herein indicates that a projection of the storage electrode line in a direction perpendicular to the array substrate at least partially overlap that of the pixel electrode.

For example, a non-display area of the array substrate comprises a predefined region in which a storage electrode pad is arranged, the storage electrode line is connected with the storage electrode pad, and in the predefined region the common electrode line is connected with the common electrode and the storage electrode pad, respectively. Since the storage electrode line and the common electrode line are connected to the storage electrode pad, the storage electrode line increases the effective area of a plate for the storage capacitance that the common electrode line act as, thus increasing the storage capacitance between the pixel electrode and the common electrode. Since the storage electrode pad is arranged in a predefined region of the non-display area, the display area of the array substrate is not influenced.

The array substrate can comprise a display area and a non-display area. For example, a region in which the pixel units are arranged can be the display area, while the remaining region can be the non-display area. The common electrode, the storage electrode line, the first insulating layer, and the second insulating layer extend to the non-display area of the array substrate, respectively.

For example, the common electrode line is made from a same material as the data lines and arranged in a same layer as the data lines, and the storage electrode line and the storage electrode pad are made from a same material as the gate lines and arranged in a same layer as the gate lines. According to this solution, the common electrode line and the data lines are made from the same material and arranged in the same layer, and the storage electrode line, the storage electrode pad, and the gate lines are made from the same material and arranged in the same layer. Thus, the common electrode line and the data lines can be formed by a same patterning process, and the storage electrode line, the storage electrode pad, and the gate lines can be formed by a same patterning process, thus simplifying fabricating process and reducing cost.

For example, the common electrode is located above the pixel electrode, the common electrode line, the data line, and the pixel electrode are arranged on the second insulating layer, and the gate lines are located below the pixel electrode.

For example, a first via hole is arranged in a region of the first insulating layer corresponding to the predefined region, the common electrode is connected with the common electrode line by means of the first via hole; a second via hole is arranged in a region of the second insulating layer corresponding to the predefined region, the common electrode line is connected with the storage electrode pad by means of the second via hole.

For example, the storage electrode line, the storage electrode pad, and the common electrode lines are made from a same material as the gate lines and arranged in a same layer as the gate lines, and the common electrode line and the storage electrode pad form an integral structure. According to this solution, the storage electrode line, the storage electrode pad, the common electrode line, and the gate lines are made from the same material and arranged in the same layer. Thus, the storage electrode line, the storage electrode pad, the common electrode line, and the gate lines can be formed by a same patterning process, thus simplifying fabricating process and reducing cost.

For example, the common electrode is located above the pixel electrode, and the gate lines are located below the pixel electrode.

For example, a third via hole is arranged in a region of the first insulating layer and the second insulating layer corresponding to the predefined region, and the common electrode is connected with the storage electrode pad by means of the third via hole.

For example, there are a plurality of storage electrode lines which are parallel with an extending direction of the gate lines, and each of the plurality of storage electrode lines corresponds to a row of the pixel electrodes.

For example, there are a plurality of predefined regions and a plurality of storage electrode pads, and each of the storage electrode pads is connected with one of the storage electrode lines;

there are a plurality of common electrode lines, each of the plurality of common electrode lines is at least connected with the storage electrode pad in one of the predefined regions, and is further connected with the common electrode in the predefined region.

For example, there are a plurality of predefined regions and a plurality of storage electrode pads, and each of the storage electrode pads is connected with one of the storage electrode lines;

there is only one common electrode line, the common electrode line is connected with the storage electrode pad in each of the predefined regions, and is connected with the common electrode at each of the predefined regions.

For example, each of the predefined regions is located between extending lines of two neighboring the gate lines, and each of the predefined regions corresponds to a row of the pixel electrodes; an extending direction of each of the common electrode lines is parallel with an extending direction of the gate lines.

For example, each of the predefined regions is located between extending lines of two neighboring the gate lines, and each of the predefined regions corresponds to a row of the pixel electrodes; an extending direction of the common electrode line is parallel with an extending direction of the data line.

For example, slits are arranged in the common electrode and in a region corresponding to the underlying pixel electrode.

The expression "a region of the common electrode corresponding to the underlying pixel electrode" used herein indicates a region of the common electrode, a projection of which in a direction perpendicular to the array substrate corresponds to that of the pixel electrode.

For example, the first insulating layer has a thickness of 1-3 μm.

The present invention further provides a display device, which comprises the above-mentioned array substrate.

The present invention provides the following beneficial effects. In the array substrate of the present invention, a storage electrode line is provided which at least partially overlaps the pixel electrode. Storage capacitance can be formed between the storage electrode line and the pixel electrode, and compensates storage capacitance formed between the common electrode and the pixel electrode. As a result, decrease of storage capacitance due to increase in thickness of the first insulating layer can be avoided. Further, the ability of charge retention of the pixel electrode can be increased, so that voltage of the pixel electrode is constant during display period of a frame, and the display effect of a picture is ensured.

The display device of the present invention comprises the above-mentioned array substrate, and can improve display quality of a display device.

DETAILED DESCRIPTION OF THE INVENTION

Figure 1:
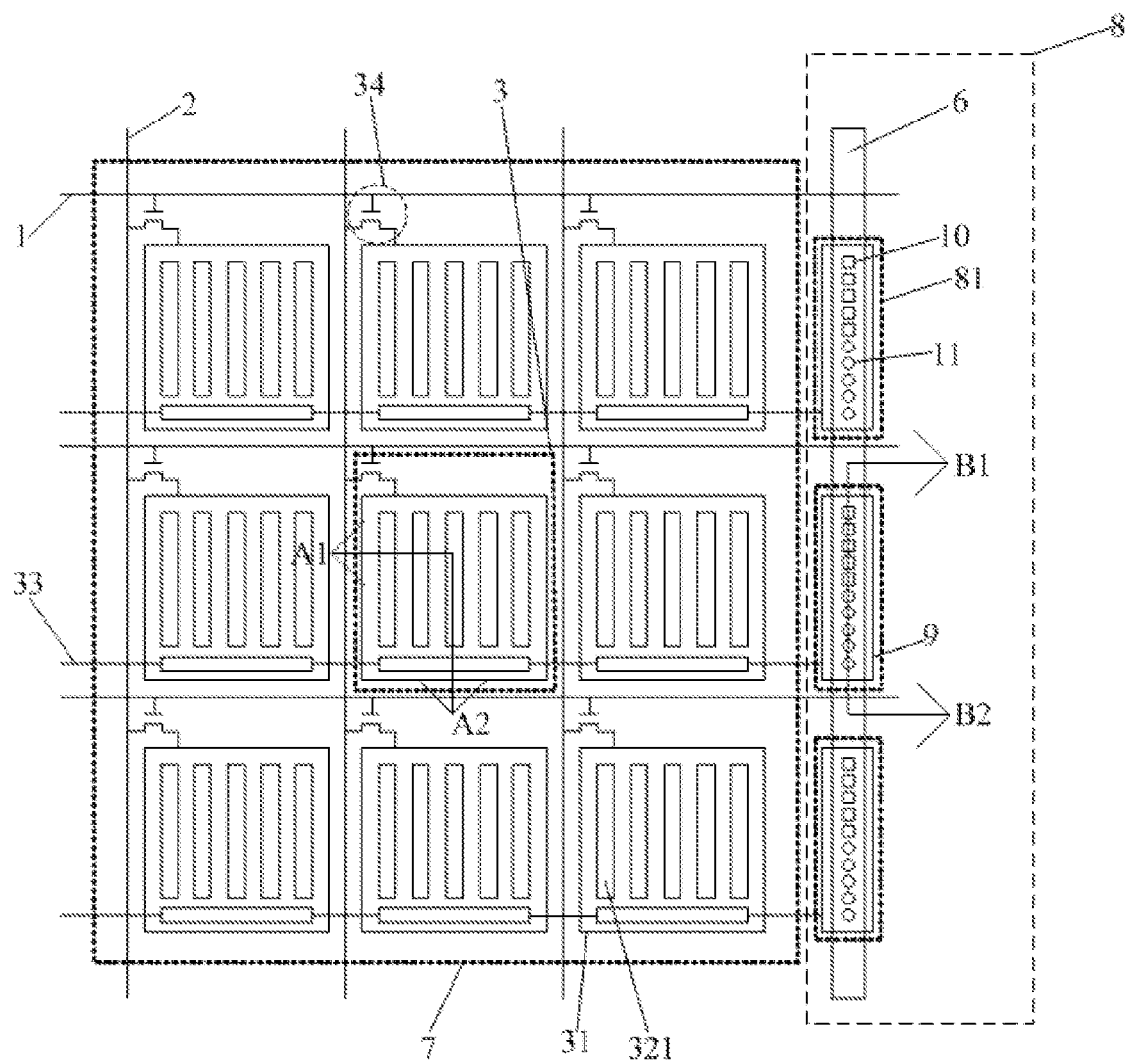
FIG. 1 is a a structural view of an array substrate in embodiment 1 of the present invention.

The array substrate and the display device of present invention will be described in details hereinafter by reference to drawings and embodiments, so that technical solutions of the present invention can be better understood by a person with skill in the art.

Reference Numerals

1 gate line; 2 data line; 3 pixel unit; 31 pixel electrode; 32 common electrode; 321 slits; 33 storage electrode line; 34 Thin film transistor; 4 first insulating layer; 5 second insulating layer; 6 common electrode line; 7 display area; 8 non-display area; 81 predefined region; 9 storage electrode pad; 10 first via hole; 11 second via hole; 12 third via hole; 13 substrate.

Embodiment 1

Figure 2:
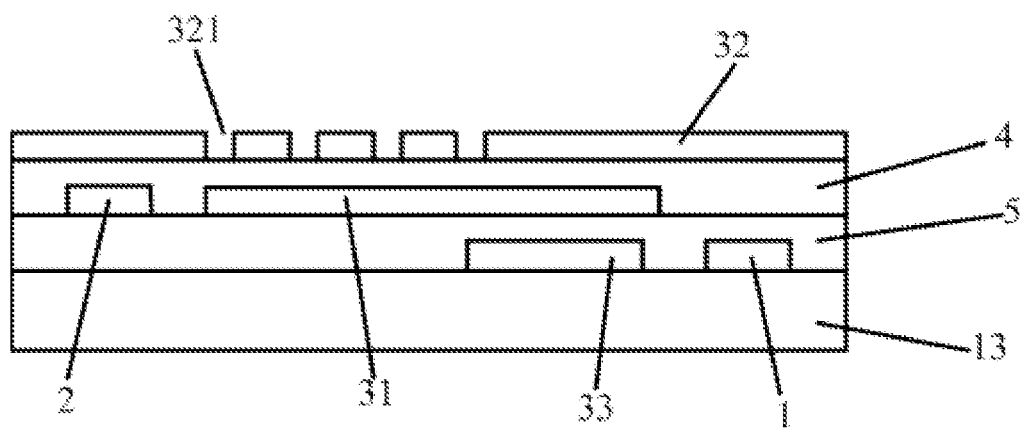
FIG. 2 is a partially cross-sectional view of an array substrate along A1A2 in FIG. 1.
Figure 3:
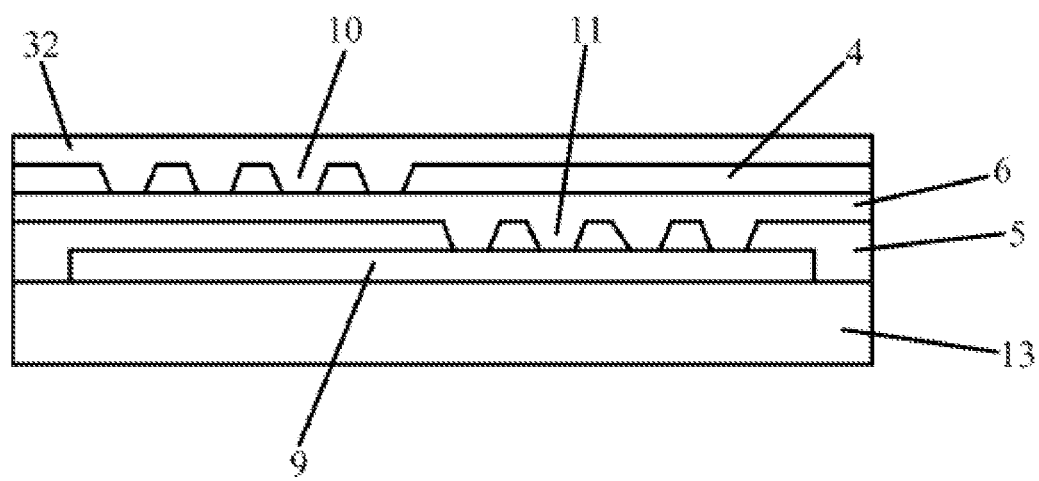
FIG. 3 is a partially cross-sectional view of an array substrate along B1B2 in FIG. 1.

The present embodiment provides an array substrate. As shown in FIGS. 1, 2, and 3, the array substrate comprises a common electrode line 6, a plurality of gate lines 1 and a plurality of data lines 2 which intersect with each other, and pixel units 3 defined by neighboring gate lines 1 and neighboring data lines 2. Each of the pixel units 3 comprises a pixel electrode 31 and a common electrode 32, and a first insulating layer 4 is arranged between the pixel electrode 31 and the common electrode 32. Each of the pixel units 3 further comprises a storage electrode line 33. The storage electrode line 33 at least partially overlaps the pixel electrode 31. A second insulating layer 5 is arranged between the storage electrode line 33 and the pixel electrode 31, and the storage electrode line 33 and the common electrode 32 is connected with the common electrode line 6, respectively.

In the array substrate, the storage electrode line 33 is provided which at least partially overlaps the pixel electrode 31. Storage capacitance can be formed between the storage electrode line 33 and the pixel electrode 31, and compensates storage capacitance formed between the common electrode 32 and the pixel electrode 31. As a result, decrease of storage capacitance due to increase in thickness of the first insulating layer 4 can be avoided. Further, the ability of charge retention of the pixel electrode can be increased, so that voltage of the pixel electrode 31 is constant during display period of a frame, and the display effect of a picture is ensured.

In this embodiment, a region in which the pixel units 3 are arranged is a display area 7, while the remaining region is a non-display area 8. The common electrode 32, the storage electrode line 33, the first insulating layer 4, and the second insulating layer 5 extend to the non-display area 8, respectively.

The non-display area 8 comprises a predefined region 81, in which a storage electrode pad 9 is arranged. The storage electrode line 33 is connected with the storage electrode pad 9. In the predefined region 81, the common electrode line 6 is connected with the common electrode 32 and the storage electrode pad 9, respectively, as shown in FIG. 3. Namely, both the common electrode 32 and the storage electrode line 33 are connected to the storage electrode pad 9. In this way, it is ensured that during display, exactly the same common voltage signal is applied to the common electrode 32 and the storage electrode line 33, so that storage capacitance formed between the storage electrode line 33 and the pixel electrode 31 can compensate storage capacitance formed between the common electrode 32 and the pixel electrode 31. As a result, storage capacitance between the pixel electrode 31 and the common electrode 32 does not decrease.

In this embodiment, the common electrode 32 is arranged above the pixel electrode 31, the common electrode line 6 is made from a same material as the data lines 2 and arranged in a same layer as the data lines 2, and the data lines 2 and the pixel electrode 31 are arranged above the second insulating layer 5. The gate lines 1 is arranged below the pixel electrode 31, and the storage electrode line 33 and the storage electrode pad 9 are made from a same material as the gate lines and arranged in a same layer as the gate lines 1. Besides, each of the pixel units 3 further comprises a thin film transistor 34. The thin film transistor 34 comprises a source, a drain, an active region, and a gate. The active region is arranged on the second insulating layer 5, and the gate and the gate lines 1 are arranged in a same layer. The source is connected with the data lines 2, the drain is connected with the pixel electrode 31, and the gate is connected with the gate lines 1.

As shown in FIG. 3, a first via hole 10 is arranged in a region of the first insulating layer 4 corresponding to the predefined region 81, and the common electrode 32 is connected with the common electrode line 6 by means of the first via hole 10. A second via hole 11 is arranged in a region of the second insulating layer 5 corresponding to the predefined region 81, and the common electrode line 6 is connected with the storage electrode pad 9 by means of the second via hole 11. In this way, the common electrode 32 and the storage electrode line 33 can be connected with the common electrode line 6, respectively.

It is also possible that the data lines 2 are arranged between the common electrode 32 and the pixel electrode 31. In this case, the first insulating layer 4 comprises an insulating layer between the data lines 2 and the pixel electrode 31 and an insulating layer between the data lines 2 and the common electrode 32. The remaining structure is the same as that described above.

In this embodiment, the storage electrode line 33 comprises a plurality of storage electrode lines, and the plurality of the storage electrode lines 33 are parallel with an extending direction of the gate lines 1. Each of the storage electrode lines 33 corresponds to a row of the pixel electrodes 31, i.e., each of the storage electrode lines 33 at least partially overlaps each of the pixel electrodes 31 in a row of pixel electrodes 31 to which the storage electrode line corresponds to. In this way, it is ensured that storage capacitance between each of the pixel electrodes 31 and the common electrode 32 is not reduced, so that the ability of charge retention of each of the pixel electrodes 31 is kept constant, thus ensuring voltage of each of the pixel electrodes 31 is constant during display of a frame.

In this embodiment, there are a plurality of predefined regions 81, and accordingly there are a plurality of storage electrode pads 9. Each of the storage electrode pads 9 is connected with one of the storage electrode lines 33. There is only one common electrode line 6, which is connected with the storage electrode pad 9 in each of the predefined regions 81, and is connected with the common electrode 32 in each of the predefined regions 81. In this way, it is ensured that the common electrode line 6 applies a same common voltage to the common electrode 32 and each of the storage electrode pads 9, so that voltage on the common electrode 32 and the storage electrode line 33 is constant during display.

In this embodiment, each of the predefined regions 81 is located between extending lines of two neighboring gate lines 1, and each of the predefined regions 81 corresponds to a row of the pixel electrodes 31. The extending direction of the common electrode line 6 is parallel with that of the data lines 2. In this way, the wiring in the non-display area 8 of the array substrate is simplified, and the yield of the array substrate is improved.

In this embodiment, slits 321 are arranged in the common electrode 32 and in a region corresponding to the underlying pixel electrode 31. In this way, a fringe field can be formed between the common electrode 32 and the pixel electrode 31, so that the fringe field switching mode can be realized in the array substrate.

In this embodiment, the first insulating layer 4 has a thickness of 1-3 μm. Namely, the storage electrode line 33 is arranged in such a manner that when the first insulating layer 4 has the above thickness, the ability of charge retention of the pixel electrode 31 is kept constant, and the display effect of a picture in each frame is ensured.

The method for fabricating the array substrate in this embodiment can comprise the following steps S1-S7.

Step S1: a metal layer is sputtered on the substrate 130. A pattern of the gate lines 1, the gate, the storage electrode line 33, and the storage electrode pad 9 is formed by applying photoresist, exposing, development, and etching.

In this step, as for the metal layer, for example, metal materials like Al, Cu, Mo, Ti, Cr or W, or alloy materials of these metal materials can be used. Besides, the gate lines can not only have a single layer structure, but also have a multi-layer structure, like Mo\Al\Mo, Ti\Cu\Ti, Mo\Ti\Cu.

Step S2: the second insulating layer 5 is deposited on the resulting substrate 13 from step S1 by chemical vapor deposition. The second via hole 11 is formed by applying photoresist, exposure, development, and etching, and the storage electrode pad 9 is partially exposed.

In this step, as for the second insulating layer 5, silicon nitride or silicon oxide can be used. The second insulating layer 5 can also adopt a multi-layer structure, for example silicon oxide\silicon nitride.

Step S3: A layer of transparent conductive material is sputtered on the resulting substrate 13 from step S2. A pattern of the pixel electrode 31 is formed by applying photoresist, exposure, development, and etching.

In this step, as for the transparent conductive material, e.g., indium tin oxide (ITO), indium doped zinc oxide (IZO), or other transparent metal oxide materials are used.

Step S4: a semiconductor layer is deposited on the resulting substrate 13 from step S3. A pattern of the active layer is formed by applying photoresist, exposure, development, and etching.

In this step, the semiconductor layer can adopt amorphous silicon, polycrystalline silicon, microcrystalline silicon, or oxide semiconductor material, for example, a-Si and n+a-Si which is deposited continuously by plasma enhanced chemical vapor deposition, or indium gallium zinc oxide (IGZO) which is deposited by sputtering.

Step S5: a metal layer is deposited on the resulting substrate 13 from step S4 by sputtering. A pattern of the data lines 2, the source, the drain, and the common electrode line 6 is formed by applying photoresist, exposure, development, and etching. The drain is connected with the pixel electrode 31.

In this step, as for the metal layer, metal materials like Al, Cu, Mo, Ti, Cr, or W, or alloy materials of these metal materials can be used.

Step S6: the first insulating layer 4 is deposited on the resulting substrate 13 from step S5. The first via hole 10 is formed by applying photoresist, exposure, development, and etching, and partially exposes the common electrode line 6.

In this step, as for the first insulating layer 4, inorganic insulating materials like silicon nitride, or organic insulating materials like organic resin materials are used.

Step S7: a layer of transparent conductive material is deposited by sputtering on the resulting substrate 13 from step S6. A pattern of the common electrode 32 is formed by applying photoresist, exposure, development, and etching.

In this step, as for the transparent conductive material, e.g., indium tin oxide (ITO), indium doped zinc oxide (IZO), or other transparent metal oxide materials are used.

Embodiment 2

Figure 4:
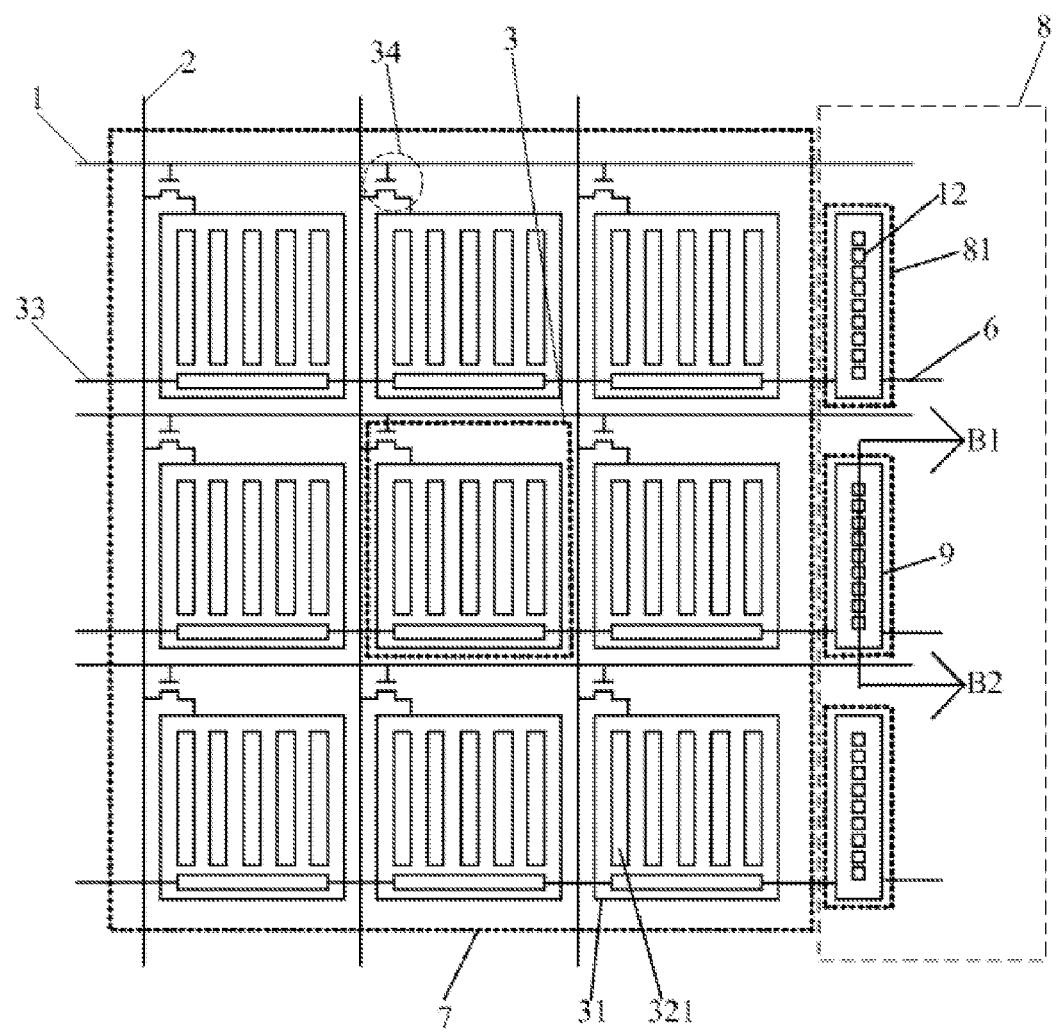
FIG. 4 is a structural view of an array substrate in embodiment 2 of the present invention.
Figure 5:
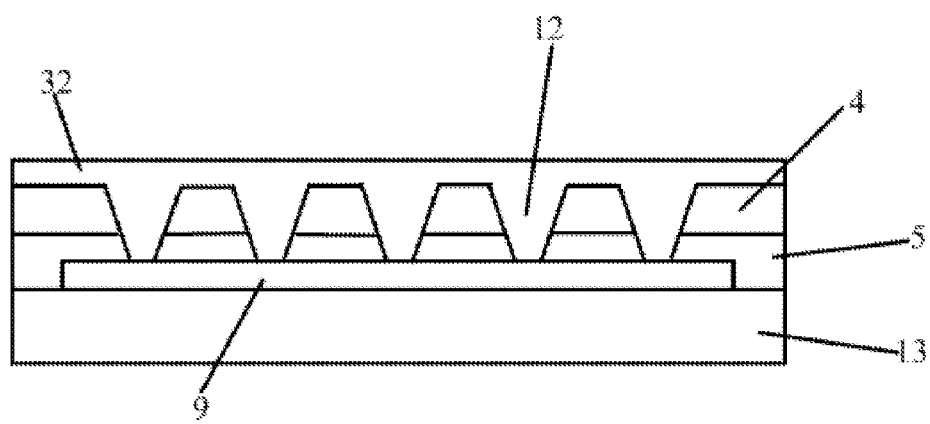
FIG. 5 is a partially cross-sectional view of an array substrate along B1B2 in FIG. 4.

The present embodiment provides an array substrate, which differs from embodiment 1 in the following aspects. As shown in FIGS. 4, 5, the common electrode 32 is located above the pixel electrode 31, the gate lines 1 are located below the pixel electrode 31, the storage electrode line 33, the storage electrode pad 9 and the common electrode line 6 are made from a same material as the gate lines and arranged in a same layer as the gate lines 1, and the common electrode line 6 and the storage electrode pad 9 form an integral structure. A third via hole 12 is arranged in a region of the first insulating layer 4 and the second insulating layer 5 corresponding to the predefined region 81, and the common electrode 32 is connected with the storage electrode pad 9 by means of the third via hole 12.

In this way, the common electrode 32 and the storage electrode line 33 can be connected with the common electrode line 6 respectively, so that the common electrode line 6 can provide a constant common voltage to the common electrode 32 and the storage electrode line 33 during display.

In this embodiment, there are a plurality of predefined regions 81, and accordingly there are a plurality of storage electrode pads 9. Each of the storage electrode pads 9 is connected with one of the storage electrode lines 33. There a plurality of common electrode lines 6. Each of the common electrode lines 6 is at least connected with the storage electrode pads 9 in one of the predefined regions 81, and is connected with the common electrode 32 at the predefined region 81 where it is connected with the storage electrode pads 9. In this way, the common electrode line 6 provides a constant common voltage to the common electrode 32 and each of the storage electrode pads 9, so that voltage on the common electrode 32 and the storage electrode line 33 is constant during display.

In this embodiment, each of the predefined regions 81 is located between extending lines of two neighboring gate lines 1, and each of the predefined regions 81 corresponds to a row of the pixel electrodes 31. An extending direction of each of the common electrode lines 6 is parallel with an extending direction of the gate lines 1. In this way, the wiring in the non-display area 8 of the array substrate is simplified, and the yield of the array substrate is improved.

Accordingly, during fabricating the array substrate of the present embodiment, at the time the gate lines 1, the gate, the storage electrode line 33, and the storage electrode pads 9 are formed, the common electrode lines 6 are formed. After deposition of the first insulating layer 4, the third via hole 12 is formed, which penetrates the first insulating layer 4 and the second insulating layer 5 and partially exposes the storage electrode pads 9. Reference can be made to embodiment 1 for the method for fabricating each layer in the array substrate, which is not repeated herein for simplicity.

Embodiments 1 and 2 have the following beneficial effects. In the array substrate of embodiments 1 and 2, storage electrode lines are provided, in which the storage electrode lines at least partially overlap the pixel electrode, so that storage capacitance can be formed between the storage electrode lines and the pixel electrode. The storage capacitance can compensate storage capacitance formed between the common electrode and the pixel electrode, so that decrease of storage capacitance between the common electrode and the pixel electrode due to increase in thickness of the first insulating layer can be avoided. Further, the ability of charge retention of the pixel electrode can be increased, so that voltage of the pixel electrode is constant during display period of a frame, and the display effect of a picture is ensured.

Embodiment 3

The present embodiment provides a display device, which comprises the array substrate of embodiment 1 or 2.

By adopting the array substrate of embodiment 1 or 2, display quality of the display device can be improved.

Although the present invention has been described above with reference to specific embodiments, it should be understood that the limitations of the described embodiments are merely for illustrative purpose and by no means limiting.

Instead, the scope of the invention is defined by the appended claims rather than by the description, and all variations that fall within the range of the claims are intended to be embraced therein. Thus, other embodiments than the specific ones described above are equally possible within the scope of these appended claims.

The invention claimed is:

1. An array substrate, comprising: a common electrode line, a plurality of gate lines and a plurality of data lines which intersect with each other, and pixel units defined by neighboring gate lines and neighboring data lines, each of the pixel units comprising a pixel electrode and a common electrode, a first insulating layer arranged between the pixel electrode and the common electrode, wherein each of the pixel units further comprises: a storage electrode line, wherein the storage electrode line and the pixel electrode at least partially overlap, a second insulating layer is arranged between the storage electrode line and the pixel electrode, and wherein the storage electrode line and the common electrode are connected with the common electrode line, respectively,
wherein a non-display area of the array substrate comprises: a predefined region in which a storage electrode pad is arranged, wherein the storage electrode line is connected with the storage electrode pad, and wherein, in the predefined region, and wherein the common electrode line is connected with the common electrode and the storage electrode pad, respectively, and
wherein the common electrode line is made from a same material as the data lines and arranged in a same layer as the data lines, and wherein the storage electrode line and the storage electrode pad are made from a same material as the gate lines and arranged in a same layer as the gate lines.

2. The array substrate of claim 1, wherein the common electrode is located above the pixel electrode, the common electrode line, the data lines, and the pixel electrodes are arranged on the second insulating layer, and the gate lines are located below the pixel electrode.

3. The array substrate of claim 1, wherein a first via hole is arranged in a region of the first insulating layer corresponding to the predefined region, wherein the common electrode is connected with the common electrode line by means of the first via hole; wherein a second via hole is arranged in a region of the second insulating layer corresponding to the predefined region, and wherein the common electrode line is connected with the storage electrode pad by means of the second via hole.

4. The array substrate of claim 1, wherein the storage electrode line, the storage electrode pad, and the common electrode lines are made from a same material the gate lines and arranged in a same layer as the gate lines, and wherein the common electrode line and the storage electrode pad form an integral structure.

5. The array substrate of claim 4, wherein the common electrode is located above the pixel electrode, and wherein the gate lines are located below the pixel electrode.

6. The array substrate of claim 4, wherein a third via hole is arranged in a region of the first insulating layer and the second insulating layer corresponding to the predefined region, and wherein the common electrode is connected with the storage electrode pad by means of the third via hole.

7. The array substrate of claim 1, wherein there are a plurality of storage electrode lines which are parallel with an extending direction of the gate lines, and wherein each of the plurality of storage electrode lines corresponds to a row of the pixel electrodes.

8. The array substrate of claim 1, wherein a plurality of storage electrode lines are parallel with an extending direction of the gate lines, each of which corresponds to a row of the pixel electrodes.

9. The array substrate of claim 2, wherein a plurality of storage electrode lines are parallel with an extending direction of the gate lines, each of which corresponds to a row of the pixel electrodes.

10. The array substrate of claim 7, further comprising: a plurality of predefined regions and a plurality of storage electrode pads, wherein each of the storage electrode pads is connected with one of the storage electrode lines;
a plurality of common electrode lines, wherein each of the plurality of common electrode lines is at least connected with the storage electrode pad in one of the predefined regions, and is further connected with the common electrode in the predefined region.

11. The array substrate of claim 7, further comprising: a plurality of predefined regions and a plurality of storage electrode pads,-wherein each of the storage electrode pads is connected with one of the storage electrode lines; and
wherein there is only one common electrode line connected with the storage electrode pad in each of the predefined regions, and connected with the common electrode at each of the predefined regions.

12. The array substrate of claim 10, wherein each of the predefined regions is located between extending lines of two neighboring the gate lines, and each of the predefined regions corresponds to a row of the pixel electrodes; and
wherein an extending direction of each of the common electrode lines is parallel with an extending direction of the gate lines.

13. The array substrate of claim 11, wherein each of the predefined regions is located between extending lines of two neighboring the gate lines, and wherein each of the predefined regions corresponds to a row of the pixel electrodes; and wherein an extending direction of the common electrode line is parallel with an extending direction of the data lines.

14. The array substrate of claim 1, wherein slits are arranged in the common electrode and in a region corresponding to the underlying pixel electrode.

15. The array substrate of claim 2, wherein slits are arranged in the common electrode and in a region corresponding to the underlying pixel electrode.

16. The array substrate of claim 1, wherein the first insulating layer has a thickness of 1-3 μm.

17. The array substrate of claim 2, wherein the first insulating layer has a thickness of 1-3 μm.

18. A display device comprising: an array substrate, wherein the array substrate comprises a common electrode line, a plurality of gate lines and a plurality of data lines which intersect with each other, and pixel units defined by neighboring gate lines and neighboring data lines, wherein each of the pixel units comprises a pixel electrode and a common electrode, wherein a first insulating layer is arranged between the pixel electrode and the common electrode, wherein each of the pixel units further comprises a storage electrode line, the storage electrode line and the pixel electrode at least partially overlap, a second insulating layer is arranged between the storage electrode line and the pixel electrode, and the storage electrode line and the common electrode are connected with the common electrode line, respectively,
wherein a non-display area of the array substrate comprises: a predefined region in which a storage electrode pad is arranged, wherein the storage electrode line is connected with the storage electrode pad, and wherein, in the predefined region, and wherein the common electrode line is connected with the common electrode and the storage electrode pad, respectively, and wherein the common electrode line is made from a same material as the data lines and arranged in a same layer as the data lines, and wherein the storage electrode line and the storage electrode pad are made from a same material as the gate lines and arranged in a same layer as the gate line

\* \* \* \* \*